United States Patent
Ha et al.

(10) Patent No.: US 10,439,087 B2
(45) Date of Patent: Oct. 8, 2019

(54) SOLAR CELL

(71) Applicant: LG ELECTRONICS INC., Seoul (KR)

(72) Inventors: Jungmin Ha, Seoul (KR); Seungyoon Lee, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/816,692

(22) Filed: Nov. 17, 2017

(65) Prior Publication Data

US 2018/0138345 A1 May 17, 2018

(30) Foreign Application Priority Data

Nov. 17, 2016 (KR) .................... 10-2016-0153486

(51) Int. Cl.
*H01L 31/05* (2014.01)
*H01L 31/0224* (2006.01)
*H01L 31/0747* (2012.01)

(52) U.S. Cl.
CPC .. *H01L 31/0512* (2013.01); *H01L 31/022425* (2013.01); *H01L 31/022433* (2013.01); *H01L 31/0504* (2013.01); *H01L 31/0747* (2013.01); *Y02E 10/50* (2013.01)

(58) Field of Classification Search
CPC ......... H01L 31/0512; H01L 31/022425; H01L 31/022433; H01L 31/0504; H01L 31/0747

USPC ........................................................ 136/256
See application file for complete search history.

(56) References Cited

U.S. PATENT DOCUMENTS

| | | | | |
|---|---|---|---|---|
| 5,178,685 A | * | 1/1993 | Borenstein | ...... H01L 31/022425 136/244 |
| 2008/0216887 A1 | * | 9/2008 | Hacke | ............ H01L 31/022441 136/244 |

FOREIGN PATENT DOCUMENTS

| | | |
|---|---|---|
| JP | 3-64964 A | 3/1991 |
| JP | 6-500670 A | 1/1994 |
| JP | 2007-103473 A | 4/2007 |
| JP | 2012-216827 A | 11/2012 |
| JP | 2002-076398 * | 3/2015 |
| KR | 10-2016-0016304 A | 2/2016 |
| WO | WO 2014/016954 A1 | 1/2014 |
| WO | WO 2017/171287 A2 | 10/2017 |

* cited by examiner

*Primary Examiner* — Jayne L Mershon
(74) *Attorney, Agent, or Firm* — Birch, Stewart, Kolasch & Birch, LLP

(57) ABSTRACT

Provided is a solar cell including: a semiconductor substrate; a conductive area disposed on one surface of the semiconductor substrate; a first electrode line disposed on the conductive area and extending in a first direction; and a second electrode line disposed on the conductive area and extending in a second direction different from the first direction, wherein the first electrode line includes first particles having a spherical shape and a first average diameter, and the second electrode line includes the first particles and second particles, the second particles having a non-spherical shape and a second average diameter.

20 Claims, 7 Drawing Sheets

SOLAR CELL

CROSS-REFERENCE TO RELATED APPLICATION

This application claims the priority benefit of Korean Patent Application No. 10-2016-0153486, filed on Nov. 17, 2016 in the Korean Intellectual Property Office, the disclosures of all of which are incorporated herein by reference in their entirety.

BACKGROUND OF THE INVENTION

1. Field of the Invention

The present disclosure relates to a solar cell, and more particularly, to a solar cell having a first electrode line and a second electrode line which are configured differently.

2. Description of the Related Art

Recently, as existing energy resources, such as petroleum and coal, are predicted to be depleted, there has been an increasing interest in alternative energy resources to replace the existing energy resources. Among the alternative energy resources, solar cells, which directly convert solar energy into electrical energy, receive attention as the next-generation cell.

The solar cell is manufactured by forming various layers and electrodes on a substrate according to designs. Adjacent solar cells are electrically connected with each other through a wiring member connected to a bus bar electrode.

When the wiring member is connected to the bus bar electrode, a solder material contained in the wiring member penetrates into the bus bar electrode, which may deteriorate adhesion of the bus bar electrode. For this reason, there has been continuous research to prevent or reduce penetration of the solder material while maintaining excellent solar cell efficiency.

SUMMARY OF THE INVENTION

In accordance with an aspect of the embodiments of the invention, there is provided a solar cell including: a semiconductor substrate; a conductive area disposed on one surface of the semiconductor substrate; a first electrode line disposed on the conductive area and extending in a first direction; and a second electrode line disposed on the conductive area and extending in a second direction different from the first direction, wherein the first electrode line includes first particles having a spherical shape and a first average diameter, and the second electrode line includes the first particles and second particles, the second particles having a non-spherical shape and a second average diameter.

DETAILED DESCRIPTION OF THE EMBODIMENTS

Figure 1:
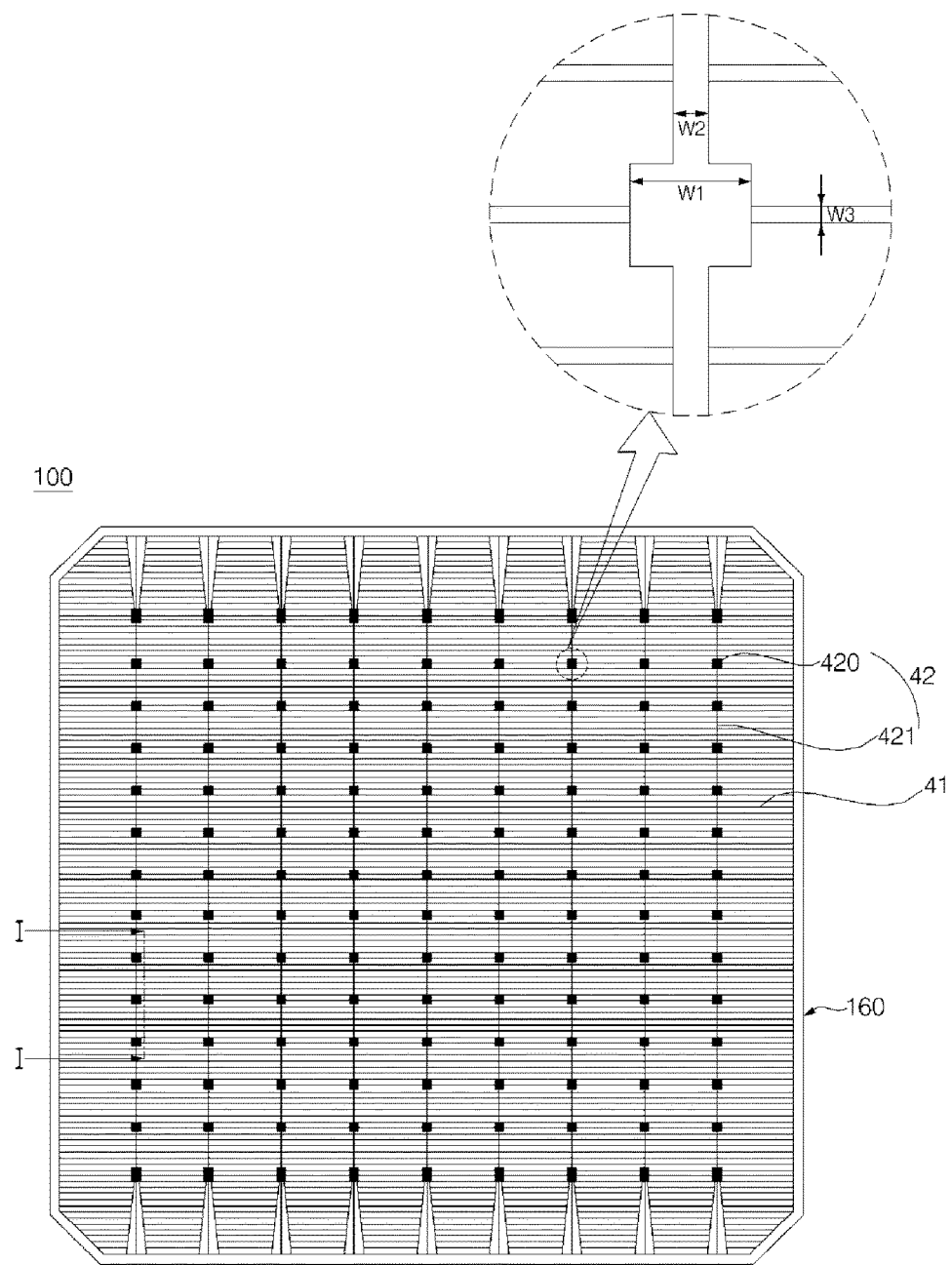
FIG. 1 is a front view of a solar cell according to embodiments of the present disclosure.

Advantages and features of the present invention and a method of achieving the same will be more clearly understood from embodiments described below with reference to the accompanying drawings. However, the present invention is not limited to the following embodiments but may be implemented in various different forms. The embodiments are provided merely to complete disclosure of the present invention and to fully provide a person having ordinary skill in the art to which the present invention pertains with the scope of the invention. The invention is defined only by the scope of the claims. Wherever possible, the same reference numbers will be used throughout the specification to refer to the same or like parts.

In the drawings, thicknesses of the layers are enlarged to clarify multiple layers and regions. Further, in the drawings, thicknesses of some layers and regions are exaggerated for convenience of explanation.

In the following description, it will be understood that when an element such as a layer, film, region, or substrate is referred to as being "on" another element, it can be "directly on" the other element or intervening elements may also be present. In contrast, when an element is referred to as being "directly on" another element, no intervening elements are present. Further, it will be understood that when a layer is referred to as being "under" another layer, it can be "directly under" the other layer, and one or more intervening layers may also be present. In contrast, when an element is referred to as being "directly under" another element, no intervening elements are present.

Hereinafter, a solar cell 100 according to example embodiments will be described with reference to FIGS. 1 to 3.

FIG. 1 is a front view of a solar cell according to embodiments of the present disclosure. FIG. 2 is a cross-sectional view of a solar cell according to embodiments of the present disclosure. Specifically, FIG. 2 is a cross-sectional view taken along line I-I of FIG. 1.

Figure 3A:
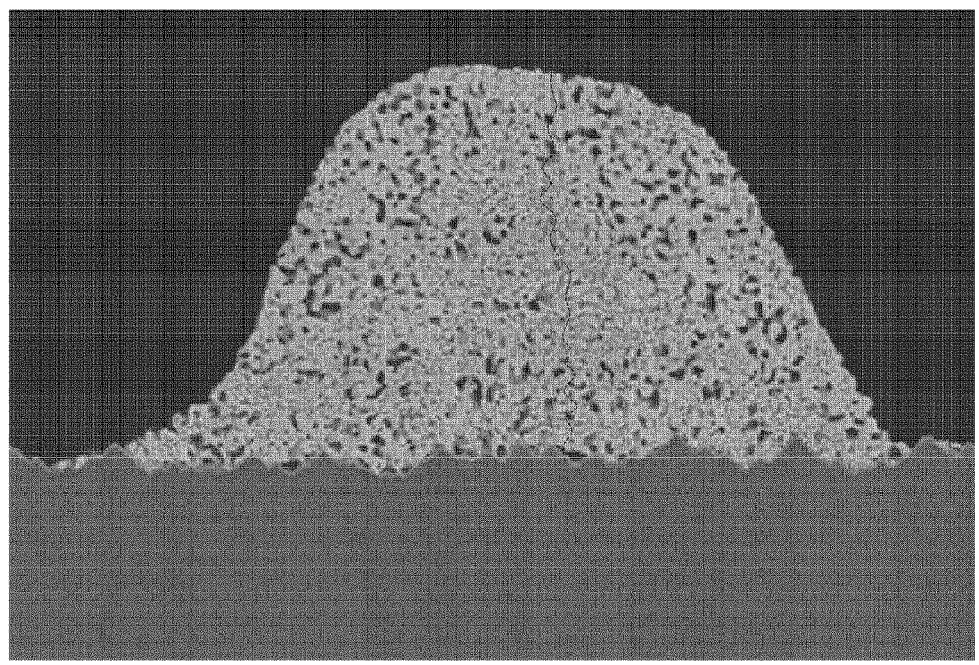
FIGS. 3A and 3B are photographs of cross-sectional views of a first electrode line and a second electrode line according to embodiments of the present disclosure.
Figure 3B:
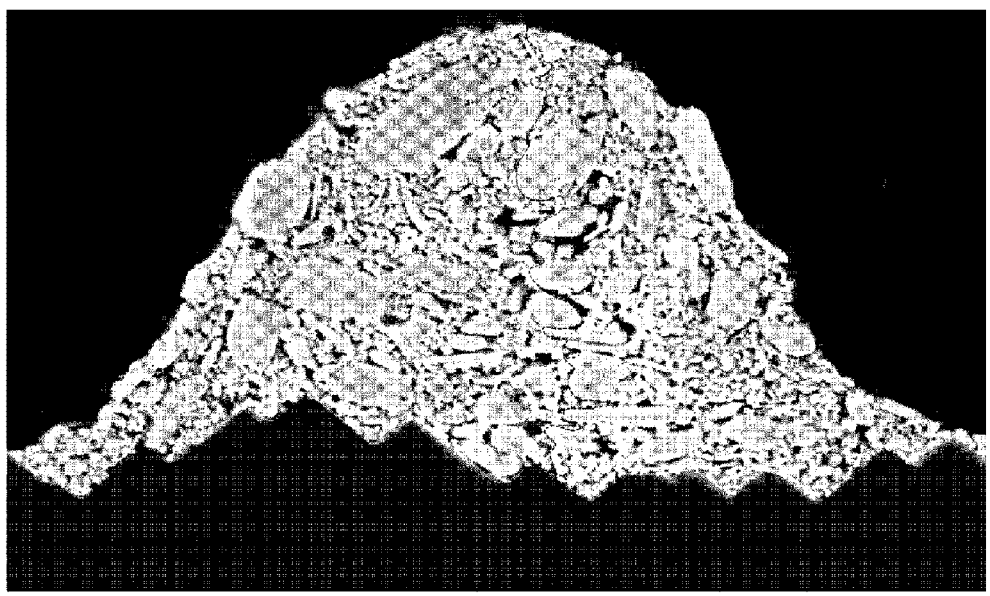

FIGS. 3A and 3B are photographs of cross-sectional views of a first electrode line and a second electrode line according to embodiments of the present disclosure. Specifically, FIG. 3A is a photograph of a cross-sectional view of a first electrode line 41, and a dotted line shows a path of penetration of a solder material; and FIG. 3B is a photograph of a cross-sectional view of a second electrode line 42, and a dotted line shows a path of penetration of a solder material.

Figure 2:
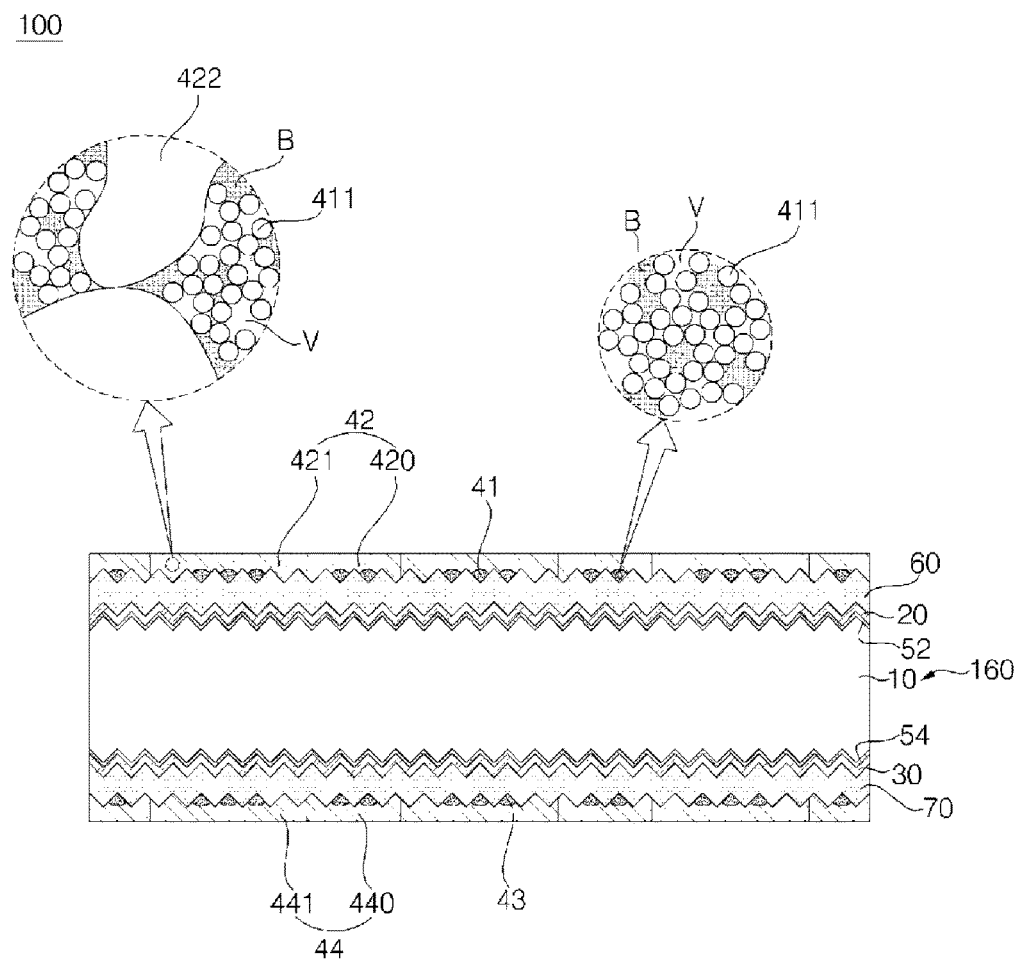
FIG. 2 is a cross-sectional view of a solar cell according to embodiments of the present disclosure.

Referring to FIGS. 1 and 2, the solar cell 100 includes a semiconductor substrate 160 including a base area 10; a first passivation film 52 formed on a front surface of the semiconductor substrate 160; a second passivation film 54 formed on a back surface of the semiconductor substrate 160; a first conductive area 20 formed on the first passivation film 52 at the side of the front surface of the semiconductor substrate 160; a second conductive area 30 formed on the second passivation film 54 at the side of the back surface of the semiconductor substrate 160; a first transparent electrode layer 60 electrically connected to the first conductive area 20; the first electrode line 41; the second electrode line 42; a second transparent electrode layer 70 electrically connected to the second conductive area 30; a third electrode line 43; and a fourth electrode line 44.

The configuration of the solar cell 100 is not limited to the above description and drawings, but may include modifications thereto that may be easily made by those skilled in the art. For example, a laminating order of each film may be changed, or a new film may be further included.

In the example embodiment of the present disclosure, description of the first electrode line 41 and the second electrode line 42 may be applied to a third electrode line 43 and a fourth electrode line 44, which are very similar to the first electrode line 41 and the second electrode line 42. Accordingly, description will be made base on the first electrode line 41 and the second electrode line 42.

In the example embodiment, the first electrode line 41 and the second electrode line 42 are configured differently, and a combination ratio and size difference of the electrode lines are controlled, such that excellent solar cell efficiency may be maintained, and penetration of a solder material may be prevented or reduced, thereby improving durability and reliability of the solar cell 100.

Specifically, the first electrode line 41, which extends in a first direction, includes first particles 411 having a spherical shape and a first average diameter; and the second electrode line 42, which extends in a second direction, and including the first particles 411 and second particles 422 having a non-spherical shape and a second average diameter which is different from the first average diameter.

That is, in the solar cell 100 of the present disclosure, the first electrode line 41 includes the first particles 411 having the first average diameter which is relatively small, thereby exhibiting excellent electrical properties, and improving carrier collection efficiency. As a result, excellent solar cell efficiency may be maintained.

The second electrode line 42 includes the first particles 411, and the second particles 422 having a non-spherical shape and the second average diameter that is relatively greater than the first average diameter, such that the second electrode line 42 includes a combination of the first particles 411 having a relatively small spherical shape and the second particles 422 having a relatively large non-spherical shape. In this manner, a path of penetration of a solder material may be complicated, and deterioration of adhesion of the second electrode may be effectively prevented or reduced.

Hereinafter, the first electrode and the second electrode may be described in further detail.

Referring back to FIGS. 1 and 2, the first electrode line 41 is disposed on a first conductive area, and may extend in a first direction.

Specifically, a plurality of first electrode lines 41, having a uniform width and pitch, may be spaced apart from each other, and each of the plurality of first electrode lines 41 extending in the first direction may be connected in the first direction continuously without disconnection therebetween, or may extend in the first direction with disconnection therebetween at regular intervals.

Figure 5A:
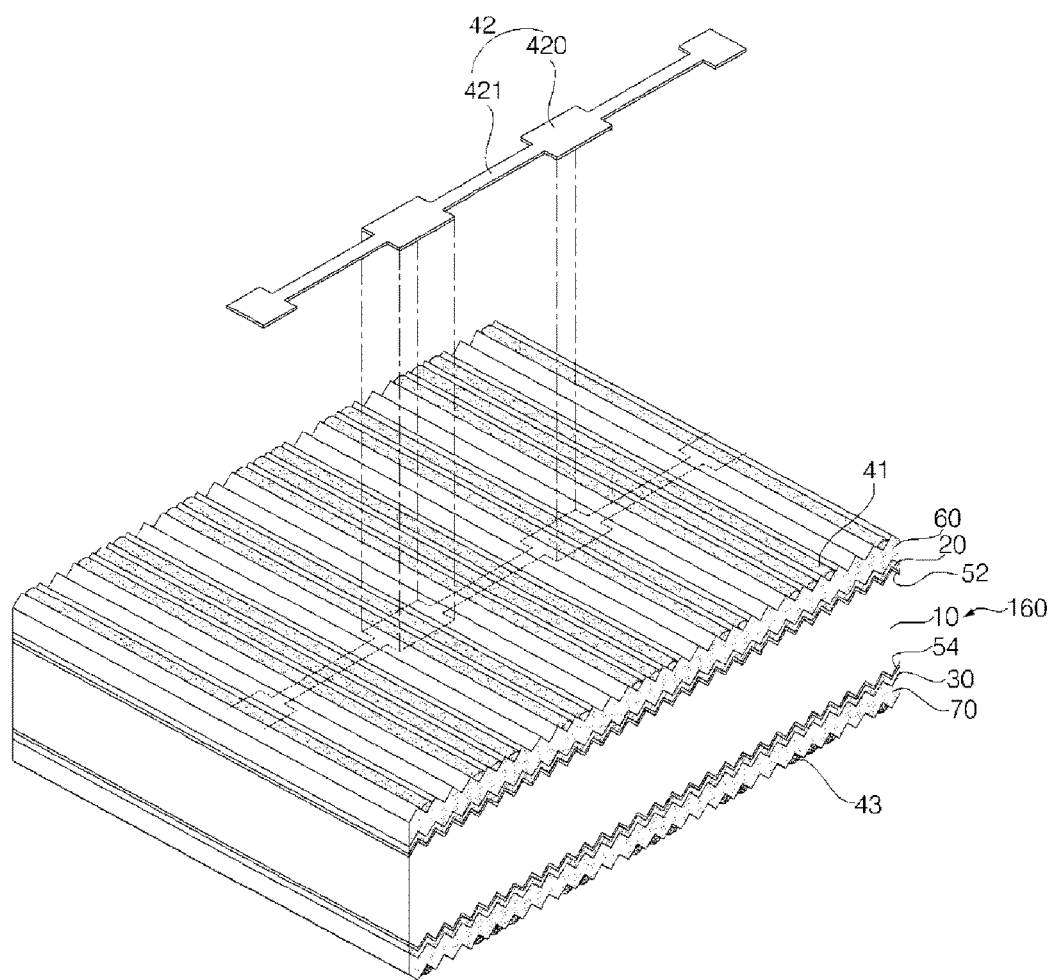
FIGS. 5A and 5B are perspective views of arrangement of a first electrode line and a second electrode line according to example embodiments of the present disclosure.

For example, referring to FIG. 5A, the plurality of first electrode lines 41 may extend in the first direction continuously without disconnection therebetween, and the second electrode lines 42 may be disposed on the first electrode lines 41 which extend continuously without disconnection therebetween.

Figure 5B:
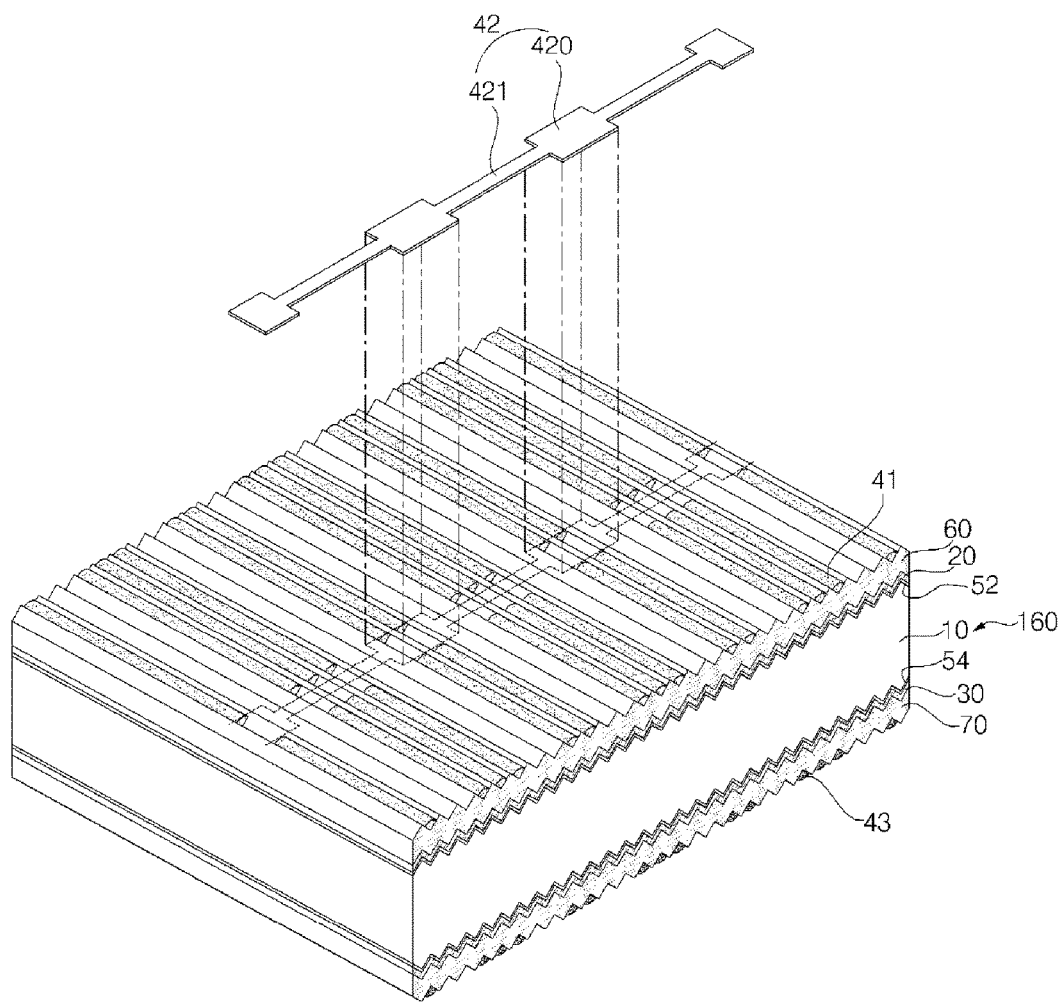

In another example, referring to FIG. 5B, the plurality of first electrode lines 41 may be disposed on an area corresponding to an area where the second electrode lines 42 are to be disposed, and may be spaced apart from each other with disconnection therebetween; and the second electrode lines 42 may be disposed on an area where the first electrode lines 41 are disconnected and spaced apart from each other.

In the description of the present disclosure, in the instance where the second electrode lines 42 are disposed on an area where the first electrode lines 41 are disconnected and spaced apart from each other, this does not strictly mean that there is no portion where the second electrode lines 42 physically overlap the first electrode lines 41, but refers to an instance where there is almost no overlapping portion of the second electrode lines 42 and the first electrode lines 41, and even an end portion of the first electrode line 41 overlaps with a portion of the second electrode line 42 in the manufacturing process.

Further, in the drawings, the first electrode lines 41 are parallel to each other in the first direction and are parallel to the edges of the solar cell 100. However, the present disclosure is not limited thereto, but may include modifications that may be easily made by those skilled in the art.

The first electrode line 41 includes the first particles 411 having a spherical shape and the first average diameter. In the instance where the first particle 411 has a spherical shape, the first average diameter may be easily formed, a filling rate may be increased when the first electrode is formed, and contact resistance may be reduced, thereby improving carrier collection efficiency and electrical properties of the first electrode line 41.

As used herein, spherical particles are in contrast with particles formed by pulverization and having a sharp surface. The spherical shape of particles does not necessarily refer to a perfect spherical shape in a mathematical sense, but should be understood as including all the spherical shapes generally used to refer to shapes of individual particles in powder form which is an aggregate of particles.

Further, the first average diameter of the first particle 411 may be in a range of about 200 nm to 400 nm.

As used herein, the average diameter refers to the average of major axis lengths of cross sections of particles in a plane passing through the particles.

As the first average diameter of the first particle 411 is maintained in the range, contact resistance may be reduced, and carrier collection efficiency may be improved, thereby effectively achieving excellent electrical properties. In the instance where the first average diameter of the first particle 411 is lower than 200 nm, production costs may be increased. In the instance where the first average diameter thereof is greater than 400 nm, a filling rate of the first electrode line 41 is reduced, and contact resistance is increased, thereby reducing efficiency of the solar cell.

The second electrode line 42 is disposed on the first conductive area, and may extend in a second direction (e.g., orthogonal direction) different from the first direction. A plurality of second electrode lines 42 are electrically connected to other solar cells when a wiring member, which will be described later and extends in the same second direction as the second electrode lines 42, is connected to each of the second electrode lines 42.

The second electrode line 42 may include not only the first particles 411 but also the second particles 422 having a non-spherical shape and the second average diameter different from the first average diameter. That is, the second electrode line 42 may include two types of particles having different sizes.

Specifically, the second particles 422 may have a non-spherical shape. In the description, the non-spherical shape should be understood as including all the shapes except a sphere having a uniform diameter in a geometric sense. As the second electrode line 42 includes the first particles 411 having a spherical shape and the second particles 422 having a non-spherical shape, the filling rate may be effectively improved, and the area of a surface of the second particles 422 may be increased, thereby maximizing the effect of preventing or reducing penetration of a solder material which will be described later.

For example, in the example embodiment, the non-spherical second particles 422 may have a flake shape.

The second average diameter of the second particles 422 may be in a range of about 1 um to 10 um.

As the second particles 422 have a non-spherical shape and are maintained in the range of the second average diameter, the filling rate of the second electrode lines 42 may be effectively increased along with the first particles 411, and the area of a surface of the second particles 422 may be improved, thereby effectively reducing penetration of a solder material. In the instance where the second average diameter of the second particle 422 is lower than about 1 um, the effect of preventing penetration of a solder material may be reduced. In the instance where the second average diameter of the second particle 422 is greater than about 10 um, the filling rate of the second electrode line 42 may be reduced, and durability and adhesion of the second electrode line 42 may be reduced.

Hereinafter, the effect of preventing or reducing penetration of a solder material by the second electrode line 42 will be described in further detail.

As described above, each of the plurality of second electrode lines 42 corresponds to and is joined to each of a plurality of wiring members which extend in the same second direction as the second electrode lines 42, such that a plurality of solar cells may be electrically connected. Specifically, the wiring member is disposed on the second electrode 42, and may include a conductive core layer and a solder layer that surrounds the core layer. As the solder layer is joined to the second electrode line 42, the wiring member is electrically connected with the solar cell 100. However, in the process of joining the solder layer to the second electrode line 42, a solder material contained in the solder layer penetrates into the second electrode line 42, and even reaches an interface formed between the second electrode line 42 and other material layer, thereby reducing adhesion of the second electrode line 42. Accordingly, in the example embodiment, by controlling materials included in the second electrode line 42 and a ratio of the contained materials, penetration of the solder material may be effectively prevented or reduced.

Referring to FIGS. 3A and 3B, when compared to the first electrode line 41 including the first particles 411 having the first average diameter, the second electrode line 42 includes both the first particles 411 and the second particles 422 having the second diameter that is relatively greater than that the first particle, such that a path of penetration of the solder material may be complicated, and penetration of the solder material may be effectively prevented or reduced.

Specifically, when the solder layer is joined to the second electrode line 42, the solder material contained in the solder layer penetrates into the second electrode line 42. In this instance, the solder material penetrates towards an interface of the second electrode line 42 from the outside along the surface of the first particles 411 and the second particles 422 included in the second electrode line 42. That is, as the path of penetration of the solder material becomes more similar to a straight line, the movement path of the solder material becomes shorter, such that the solder material may easily penetrate into the interface of the second electrode line 42.

Referring back to FIG. 3A, as in the instance of the first electrode line 41, if the second electrode line 42 includes only the spherical first particles 411, which have a relatively small first average diameter, without the second particles 422, the surfaces of spherical first particles 411 contact each other, such that the path (dotted line) of penetration of the solder material becomes more similar to a straight line, thereby allowing for easy penetration of the solder material, and thus reducing adhesion of the second electrode line 42.

By contrast, referring back to FIG. 3B, in the instance where the second electrode line 42 includes both the first particles 411 and the non-spherical second particles 422 having a relatively large second average diameter as described above, the second particles 422 and the first particles 411 are properly filled in the second electrode line 42, and the area of the surface of the second particles 422 is large such that the path (dotted line) of penetration of the solder material is not similar to a straight line, and becomes curved by forming large and small curves along the surface of the second particles 422. Accordingly, a movement distance of the solder material is lengthened, and reduction of adhesion of the second electrode line 42 may be effectively prevented or reduced.

The effect of preventing or reducing penetration of the solder material by the second electrode line 42 may be maximized by controlling a mixing ratio of the first particles 411 and the second particles 422 and a size ratio of the second particles 422 to the first particles 411.

Specifically, the volume of the second particles 422 may be in a range of about 100 times to 50000 times the volume of the first particles 411.

By maintaining the volume ratio of the second particles 422 to the first particles 411 in the range, a proper or a desired level of filling rate may be provided, and penetration of the solder material may be effectively prevented or reduced. In the instance where the volume of the second particles 422 is lower than 100 times the volume of the first particles 411, the effect of lengthening a path of penetration of the solder material may be significantly reduced. In the instance where the volume of the second particles 422 is greater than 50000 times the volume of the first particles 411, the size of the second particle 422 is too large to form the second electrode line 42 in the manufacturing process, and the second particles 422 may not be included at a proper or a desired level in the second electrode line 42, thereby reducing the effect of lengthening a path of penetration of the solder material.

Further, a ratio of the total volume of the second particles 422 to the total volume of the first particles 411 included in the second electrode line 42 may be in a range of 3:7 to 7:3. By maintaining the ratio of the total volume of the second particles 422 to the total volume of the first particles 411 in the range, a filling rate of the second electrode line 42 may be maintained at a proper or a desired level, thereby enabling the second particles 422 to provide the effect of lengthening a path of penetration of the solder material.

In the instance where the ratio of the total volume of the second particles 422 to the total volume of the first particles 411 included in the second electrode line 42 is not within the range, the filling rate is reduced, thereby reducing the effect of preventing or reducing penetration of the solder material.

As described above, the first electrode line 41 maintains the carrier collection efficiency to provide excellent solar cell efficiency, and the second electrode line 42 prevents or reduces penetration of the solder material to maintain excellent durability and reliability of the solar cell 100.

The second electrode line 42 may be formed by curing a second composition containing the first particles 411 and the second particles 422. Specifically, the second composition, which forms a second metal line that is joined to a wiring member or a solder layer, may contain a material that may be fired by low-temperature calcination (e.g., calcination at a processing temperature equal to or lower than 300° C.).

For example, the second composition may include only the first particles 411, the second particles 422, a binder (B), and other resin (e.g., a curing agent or an additive) without a glass frit which contains a metallic compound (e.g., an oxide containing oxygen, a carbon containing carbide, a sulfur containing sulfide) and the like.

However, the second composition is not limited thereto, and may include modifications that may be easily made by those skilled in the art according to a purpose of the invention.

In embodiments of the present disclosure, the second metal line may be formed by contacting the first transparent electrode layer 60, such that a fire-through, which penetrates into an insulation film and the like, is not required. Accordingly, the second metal line may be formed by applying (e.g., printing) the second composition, from which a glass frit is removed, and by curing the resulting composition by heat treatment.

As described above, in the instance where the second composition does not include the glass frit, metals of the second metal line are not sintered, but are aggregated by contacting each other, such that the second metal line may have conductivity simply by curing.

In the second metal line formed simply by curing, some portions between the first particles 411 and the second particles 422 may be filled by the binder (B), and other portions may remain as openings or voids (v).

The first particles 411 and the second particles 422 may contain various materials that provide conductivity. For example, metal particles may include silver (Ag), aluminum (Al), and copper (Cu), or may include silver (Ag), silver (Ag) coated with tin (Sn), aluminum (Al), and copper (Cu) alone or in combination of two or more thereof. For example, the first particles 411 and the second particles 422 may contain an identical conductive material.

The binder (B) performs the function of crosslinking metals to form the second metal line while preventing or reducing penetration of the solder material into the second metal line. Unlike the example embodiment of the present disclosure, if the binder (B) is not included, the solder material penetrates into the second metal line, such that the second metal line becomes brittle and is prone to break easily by small shock, impact and the like. Further, when the solder material penetrates into the interface of the second metal line, adhesion of the second metal line may be reduced.

That is, by filling a space between the first particles 411 and the second particles 422, the binder (B) included in the second composition prevents or reduces penetration of the solder material along with the first particles 411 and the second particles 422.

Further, by controlling a ratio of materials contained in the second composition, the effect of preventing or reducing penetration of the solder material may be maximized.

Specifically, the second composition may contain about 15 parts by weight to 40 parts by weight of the binder (B) with respect to 100 parts by weight of the second composition. By maintaining the amount of the binder (B) contained in the second composition in the range, penetration of the solder material may be reduced while providing excellent adhesion of the second electrode line 42, and satisfying a proper or a desired level of mechanical properties.

In the instance where the amount of the binder (B) contained in the second composition is lower than about 15 parts by weight, adhesion of the second electrode line 42 and the effect of preventing or reducing penetration of the solder material may be reduced. In the instance where the amount of the binder (B) contained in the second composition is greater than about 40 parts by weight, mechanical and electrical properties of the second electrode line 42 may be deteriorated.

In addition, the second composition may contain about 60 parts by weight to 85 parts by weight of the first particles 411 and the second particles 422 with respect to 100 parts by weight of the second composition. By maintaining the amount of the first particles 411 and the second particles 422 contained in the second composition in the range, a proper or a desired level of filling rate and the effect of preventing or reducing penetration of the solder material may be provided. In the instance where the amount of the first particles 411 and the second particles 422 contained in the second composition is lower than about 60 parts by weight, mechanical and electrical properties of the second electrode line 42 may be deteriorated, and the desired effect of preventing or reducing penetration of the solder material may not be achieved. In the instance where the amount of the first particles 411 and the second particles 422 contained in the second composition is greater than about 85 parts by weight, the adhesion and filling rate of the second electrode line 42 may be reduced.

Further, viscosity of the second composition may be in a range of about 200 Pa·s to 300 Pa·s. By maintaining the viscosity of the second composition in the range, the pad portion 420 to be described later may be easily formed, and dispersibility of the first particles 411 and the second particles 422 may be improved.

That is, by controlling the binder (B), the first particle 411, and the second particles 422 which are contained in the second composition, and by controlling viscosity of the second composition, electrical and mechanical properties may be maintained at a proper or desired level while providing excellent effect of preventing or reducing penetration of the solder material.

The first electrode line 41 may be formed by curing the first composition containing the first particles 411, and description of the second composition may be applied to the first composition except for characteristics of the first composition which will be described later, such that description will be made based on differences between the first composition and the second composition.

Unlike the second composition, the first composition contains only the first particles 411 without the second particles 422. The first composition may contain about 85 parts by weight to 95 parts by weight of the first particles 411 with respect to 100 parts by weight of the first composition. As the amount of the first particles 411 contained in the first composition is in the range, excellent or desired electrical properties may be achieved. In the instance where the amount of the first particles 411 contained in the first composition is lower than about 85 parts by weight, electrical and mechanical properties may be deteriorated. In the instance where the amount of the first particles 411 contained in the first composition is greater than about 95 parts by weight, adhesion of the first electrode may be reduced.

Further, the first composition may contain about 5 parts by weight to 15 parts by weight of the binder (B) with respect to 100 parts by weight of the first composition. By maintaining the amount of binder (B) contained in the first composition in the range, a proper or a desired level of adhesion, and mechanical and electrical properties of the first electrode line 41 may be provided. In the instance where the amount of binder (B) contained in the first composition is lower than about 5 parts by weight, adhesion of the first electrode line 41 may be reduced. In the instance where the amount of binder (B) contained in the first composition is greater than about 15 parts by weight, electrical and mechanical properties of the first electrode line 41 may be deteriorated.

In addition, viscosity of the first composition may be about 500 Pa·s to 700 Pa·s. By maintaining the viscosity of the first composition at a relatively higher level than the viscosity of the second composition, the first electrode line 41 having a narrow width may be easily formed, thereby minimizing reduction in a light receiving area.

That is, by controlling a ratio of the binder (B) and the first particles 411 contained in the first composition as well as the viscosity of the first composition, excellent electrical properties may be achieved while maintaining a proper or a desired level of mechanical properties.

The second electrode line 42 formed by curing the second composition may include a plurality of pad portions 420, and line portions 421 formed between the plurality of pad portions 420 and having a smaller width than a width W1 of the pad portions 420. By using the line portions 421, the pad portions 420 may be formed continuously without disconnection.

Description of the pad portions 420 and the line portions 421 may be applied to description of rear pad portions 440 and rear line portions 441 included in the fourth electrode line 44 which is similar to the second electrode line 42.

The line portions 421, having a narrow width, may minimize an area where light incident on solar cell 100 is blocked, and the line portions 421 are connected with the plurality of first electrode lines 41, such that when some of the first electrode lines 41 are disconnected, the line portions 421 may provide a bypass route of carriers.

Specifically, the pad portion 420, for example, which is a portion where the second electrode line 42 and a wiring member are connected or joined to each other, may have a width larger than the width of the wiring member. The pad portion 420 has a relatively larger width than the width of the line portion 421 and the wiring member, thereby enabling the wiring member to be connected stably, and reducing contact resistance.

Referring back to FIGS. 1 and 2, the second electrode line 42 intersects the first electrode line 41 that extends in the first direction, and may extend in the second direction.

For example, the first electrode line 41 and the second electrode line 42 may be orthogonal to each other; some portions of the second electrode line 42 may be disposed on the first electrode line 41; and widths W1 and W2 of the second electrode line 42 may be greater than a width W3 of the first electrode line 41. Accordingly, portions where the first electrode lines 41 and the second electrode lines 42 overlap may have a shape in which the second electrode lines 42 are stacked on the first electrode lines 41, or a shape in which the first electrode lines 41 are continuously formed or are spaced apart from each other at regular intervals.

Accordingly, some portion of the second electrode line 42 may be disposed on the first electrode line 41, and other portion thereof may not be disposed on the first electrode line 41, but an upper surface of the second electrode line 42 may be disposed on the same flat plane. That is, the thickness of a portion of the second electrode line 42 that is disposed on the first electrode line 41 may be thinner than a portion of the thickness of the second electrode line 42 that is not disposed on the first electrode line 41.

As the upper surface of the second electrode line 42 is disposed on the same flat plane, or the upper surface is flat along the entire length of the second electrode line 42, the wiring member may be stably joined to the second electrode line 42 on the same flat plane, thereby enabling a highly reliable and excellent level of adhesion of the wiring member and the solar cell 100.

Hereinafter, other elements included in the solar cell 100 will be described in further detail.

Referring back to FIG. 2, a semiconductor substrate 160 may be formed of crystalline semiconductors of a first or a second conductive type, which are formed by doping at a low doping density a first or a second conductive dopant which is a base dopant. For example, the semiconductor substrate 160 may be formed of monocrystalline or polycrystalline semiconductors (e.g., monocrystalline or polycrystalline silicon). Specifically, the semiconductor substrate 160 may be formed of monocrystalline semiconductors (e.g., monocrystalline semiconductor wafer, more specifically monocrystalline silicon wafer). As described above, by using such semiconductor substrate 160 with high crystallinity and low defects, the solar cell 100 may have excellent electrical properties. In this instance, the semiconductor substrate 160 may include only a base 10 without a doped area formed by additional doping and the like. Accordingly, passivation properties of the semiconductor substrate 160 may be prevented or reduced from being deteriorated which is caused when the doped area is formed.

A front surface and/or a back surface of the semiconductor substrate 160 may be subjected to texturing to have protrusions, so that reflection may be prevented or reduced. For example, the protrusions may have specific crystal faces, and may have an approximately pyramidal shape with four outer surfaces being formed by (111) faces of the semiconductor substrate. However, the present disclosure is not limited thereto, and the protrusions may be not formed on the surfaces of the semiconductor substrate 160.

A first passivation film 52 is formed on (e.g., in contact with) the front surface of the semiconductor substrate 160, and a second passivation film 54 is formed on (e.g., in contact with) a back surface of the semiconductor substrate 160, thereby improving passivation properties. For example, the first passivation film 52 and the second passivation film 54 may be formed of intrinsic amorphous semiconductors (e.g., intrinsic amorphous silicon (i-a-Si)) layer. In this manner, the first passivation film 52 and the second passivation film 54 contain the same semiconductor material as the semiconductor substrate 160 and thus have similar properties, such that passivation properties may be further effectively and greatly improved. However, the present disclosure is not limited thereto, and the first passivation film 52 and/or the second passivation film 54 may include an intrinsic amorphous silicon carbide (i-a-SiCx) layer or an intrinsic amorphous silicon oxide (i-a-SiOx) layer. In this instance, the effect produced by a wide energy band gap may be improved, but passivation properties may be less good than the instance of intrinsic amorphous silicon (i-a-Si) layer.

A first conductive area 20, which includes a first conductive dopant or has a first conductive type, and has a higher doping density than the semiconductor substrate 160, may be disposed on (e.g., in contact with) the first passivation film 52. Further, a second conductive area 30, which includes a second conductive dopant or has a second conductive type opposite to the first conductive type, may be disposed on (e.g., in contact with) the second passivation film 54. Once the first passivation film 52 and the second passivation film 54 contact the first conductive area 20 and the second conductive area 30 respectively, a transport path of carriers may be shortened, and the structure may be simplified.

As the first conductive area 20 and the second conductive area 30 are formed independently from the semiconductor substrate 160, the first conductive area 20 and the second conductive area 30 may be made of a material and/or crystalline structure different from the semiconductor substrate 160, so that the first conductive area 20 and the second conductive type area 30 may be easily formed on the semiconductor substrate 160.

For example, the first conductive area 20 and the second conductive area 30 may be formed by doping amorphous semiconductors, which may be easily manufactured in various manners such as by deposition and the like, with the first or the second conductive dopant. Accordingly, the first conductive area 20 and the second conductive area 30 may be formed easily in a simple process.

In this instance, the semiconductor substrate 160 may have the first conductive type. Then, the first conductive area 20 has the same conductive type as the semiconductor substrate 160 and forms a front electric field region having a high doping density; and the second conductive area 30 has a conductive type opposite to that of the semiconductor substrate 160 and forms an emitter region. Accordingly, the second conductive area 20, which is the emitter region, is positioned on the back of the semiconductor substrate 110 in a manner that does not hinder light absorption on the top surface, such that the emitter region may be formed to be relatively thick. The first conductive area 20, which is the front electric field region, is not directly involved in photoelectric conversion, and is positioned on the front surface of the semiconductor substrate 110 for light absorption on the front surface, such that the first conductive area 20 may be formed to be relatively thin. In this manner, light loss caused by the first conductive area 20 may be minimized.

A p-type dopant, used as the first or the second conductive dopant, may be a Group III element such as boron (B), aluminum (Al), gallium (Ga) or indium (In). An n-type dopant may be a Group V element such as phosphorus (P), arsenic (As), Bismuth (Bi), or antimony (Sb). However, various other dopants may also be used as the first or the second conductive dopant.

For example, the semiconductor substrate 160 and the first conductive area 20 may be an n-type and the second conductive area 30 may be a p-type. In this instance, the semiconductor substrate 160, which has an n-type, allows for excellent life time of carriers. For example, the semiconductor substrate 160 and the first conductive area 20 may include phosphorus (P) as an n-type dopant, and the second conductive area 30 may include boron (B) as a p-type dopant. However, the present disclosure is not limited thereto, and the first conductive type may be a p-type and the second conductive type may be an n-type.

In the example embodiment, the first conductive area 20 and the second conductive area 30 may include at least one of the following: an amorphous silicon (a-Si) layer, an amorphous silicon oxide (a-SiOx) layer, an amorphous silicon carbide (a-SiCx) layer, an indium-gallium-zinc oxide (IGZO) layer, a titanium oxide (TiOx) layer, and a molybdenum oxide (MoOx) layer. In this instance, the amorphous silicon (a-Si) layer, the amorphous silicon oxide (a-SiOx) layer, and the amorphous silicon carbide (a-SiCx) layer may be doped with the first or the second conductive dopant. The indium-gallium-zinc oxide (IGZO) layer, the titanium oxide (TiOx) layer, and the molybdenum oxide (MoOx) layer may perform the same function as an n-type or a p-type conductive area by selectively collecting electrons or holes without a dopant. For example, the first conductive area 20 and the second conductive area 30 may include the amorphous silicon (a-Si) layer. In this instance, the first conductive area 20 and the second conductive area 30 include the same semiconductor material (i.e., silicon) as the semiconductor substrate 160, such that the first conductive area 20 and the second conductive area 30 may have similar properties to the semiconductor substrate 160. Accordingly, carriers may move more effectively, and a stable structure may be formed.

A first transparent electrode layer 60, the first metal line, and the second metal line 42, which are electrically connected to the first conductive area 20, are disposed on (e.g., in contact with) the first conductive area 20. A second transparent electrode layer 70, the third electrode line 43, and the fourth electrode line 44, which are electrically connected to the second conductive area 30, are disposed on (e.g., in contact with) the second conductive area 30.

Here, the first transparent electrode layer 60 may be formed over (e.g., in contact with) the entire first conductive area 20. The term "entire" indicates not only the instance where the entire first conductive area 20 is covered without an empty space or an empty area, but also the instance where a portion of the first conductive area 20 is inevitably excluded.

As described above, the first transparent electrode layer 60 is formed over the entire first conductive area 20, such that the first transparent electrode layer 60 may be made of a material capable of transmitting light (light-transmitting material). For example, the first transparent electrode layer 60 may include at least one of the following: indium tin oxide (ITO), aluminum zinc oxide (AZO), boron zinc oxide (BZO), indium tungsten oxide (ITO), titanium-tantalum-doped indium oxide, and indium cesium oxide (ICO). However, the present disclosure is not limited thereto, and the first transparent electrode layer 60 may include various other materials.

In this instance, while using the above-described materials as main materials, the first transparent electrode layer 60 may include hydrogen. As the first transparent electrode layer 60 includes hydrogen, the mobility of electrons or holes may be improved, and transmittance may also be improved.

Further, the first electrode line 41 and the second electrode line 42, which have a pattern, may be formed on the first transparent electrode layer 60. However, the present disclosure is not limited thereto.

Subsequently, referring to FIG. 4, a solar cell 200 according to embodiments of the present disclosure will be described in detail. When compared to the solar cell 100 described above with reference to FIGS. 1 to 3, the solar cell 200 is substantially the same as the solar cell 100 except that the solar cell 200 has a multi-layered structure. Accordingly, detailed description thereof will be omitted, and only differences will be described in detail. Further, combinations of the above embodiments or modifications thereof and the following embodiments or modifications thereof are also within the scope of the invention.

Figure 4:
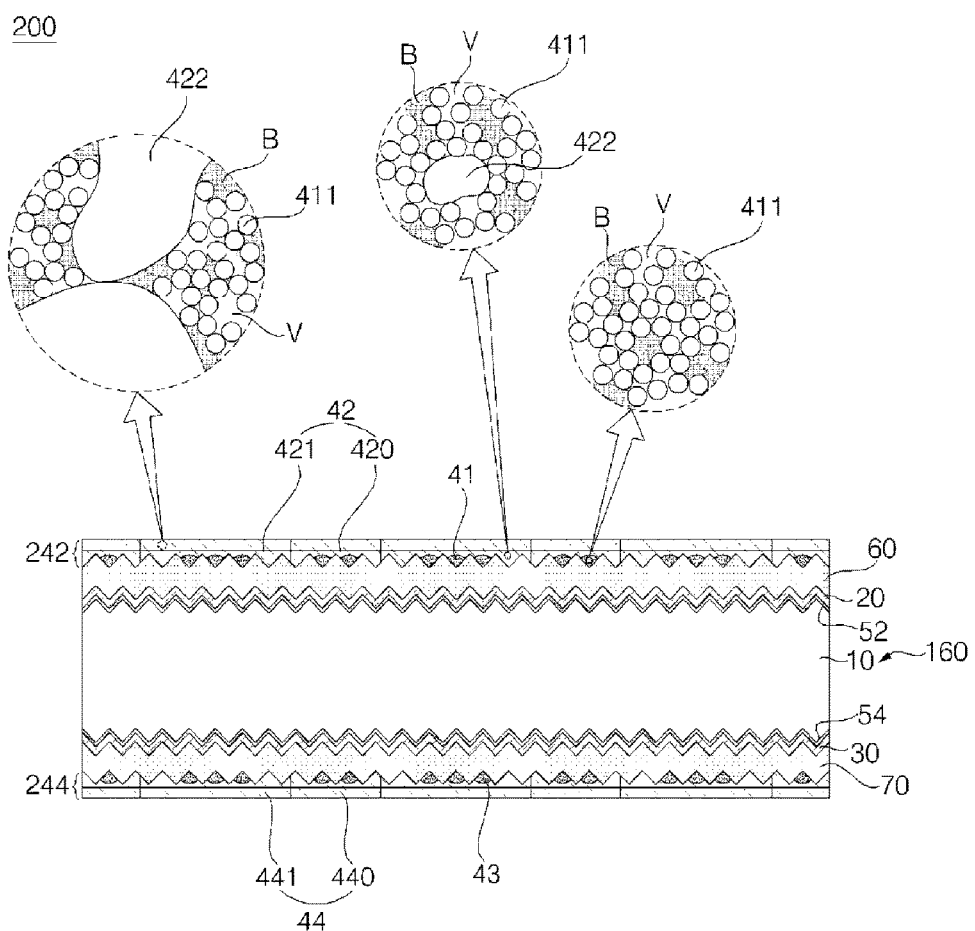
FIG. 4 is a cross-sectional view of a solar cell according to embodiments of the present disclosure.

FIG. 4 is a cross-sectional view of a solar cell according to embodiments of the present disclosure. Referring to FIG. 4, the second electrode line 242 has a multi-layered structure, with each layer having a different ratio of the second particles 422 to the first particles 411. Description of the second electrode line 242 may be applied to description of the fourth electrode line 244.

Specifically, in the multi-layered structure of the second electrode lines 242, the proportion of the second particles 422 may increase as the second electrode lines 242 are further spaced apart on the first conductive area.

That is, the non-spherical second particles 422, having a relatively large second average diameter, are more included in the upper portion of the second electrode lines 242, rather than in the lower portion of the second electrode lines 242, thereby effectively lengthening a path of penetration of the solder material, and maximizing the effect of preventing or reducing penetration of the solder material.

In the embodiment, the second electrode lines 242 may be formed to have a multi-layered structure by a plurality of times of printing. For example, the second composition may be printed by a first, second, and third times of printing, and the volume ratio of the second particles 422 to the first particles 411 may be controlled to increase as the number of times of printing is increased. Accordingly, the second electrode line 42 having a multi-layered structure may be formed, in which as the second electrode lines 42 are further spaced apart on the first conductive area, the proportion of the second particles 422 increases.

The features, structures, and effects illustrated in the above embodiments may be included in at least one embodiment of the invention but are not limited to one embodiment. Further, those skilled in the art will appreciate that various combinations and modifications of the features, structures, and effects illustrated in the respective embodiments are possible. Therefore, it will be understood that these combinations and modifications are covered by the scope of the invention.

What is claimed is:

1. A solar cell comprising:
   a semiconductor substrate;
   a conductive area disposed on one surface of the semiconductor substrate;
   a plurality of first electrode lines disposed on the conductive area and extending in a first direction; and
   a plurality of second electrode lines disposed on the conductive area and extending in a second direction different from the first direction,
   wherein the plurality of first electrode lines include first particles having a spherical shape and a first average diameter, and the plurality of second electrode lines include the first particles and second particles, the second particles having a non-spherical shape and a second average diameter,
   wherein each of the plurality of second electrode lines further includes a plurality of pad portions and a plurality of line portions,
   wherein the plurality of line portions are disposed between the plurality of pad portions, and
   wherein the plurality of first electrode lines intersect the plurality of pad portions and the plurality of line portions of each second electrode line.

2. The solar cell of claim 1, wherein a volume of the second particles is 100 times to 50000 times a volume of the first particles.

3. The solar cell of claim 1, wherein the first average diameter is in a range of 200 nm to 400 nm, and the second average diameter is in a range of 1 um to 10 um.

4. The solar cell of claim 1, wherein a ratio of a total volume of the second particles to a total volume of the first particles included in the each second electrode line is in a range of 3:7 to 7:3.

5. The solar cell of claim 1, wherein the each second electrode line intersects the plurality of first electrode lines, such that a portion of the each second electrode line is disposed on the plurality of first electrode lines.

6. The solar cell of claim 5, wherein an upper surface of the each second electrode line is a flat plane.

7. The solar cell of claim 1,
   wherein the each second electrode line is disposed on an area of the conductive area where the plurality of first electrode lines are disconnected and spaced apart from each other.

8. The solar cell of claim 1, wherein a width of one pad portion W1 and a width of one line portion W2 of the each second electrode line are greater than a width W3 of at least one of the plurality of first electrode lines.

9. The solar cell of claim 1, wherein the each second electrode line has a multi-layered structure, with each layer having a different ratio of the second particles to the first particles included in the each second electrode line.

10. The solar cell of claim 9,
    wherein, as the plurality of second electrode lines are further spaced from the semiconductor substrate on the conductive area, a proportion of the second particles in the plurality of second electrode lines increases.

11. The solar cell of claim 1, further comprising a wiring member disposed on the each second electrode line, wherein the wiring member includes a core layer and a solder layer surrounding the core layer.

12. The solar cell of claim 1, wherein the plurality of first electrode lines include a first composition containing the first particles and a binder.

13. The solar cell of claim 12, wherein the first composition contains 85 parts by weight to 95 parts by weight of the first particles with respect to 100 parts by weight of the first composition.

14. The solar cell of claim 12, wherein the first composition contains 5 parts by weight to 15 parts by weight of the binder with respect to 100 parts by weight of the first composition.

15. The solar cell of claim 12, wherein a viscosity of the first composition is in a range of 500 Pa·s to 700 Pa·s.

16. The solar cell of claim 1, wherein the each second electrode line includes a second composition containing the first particles, the second particles, and a binder.

17. The solar cell of claim 16, wherein the second composition contains 60 parts by weight to 85 parts by weight of the first particles and the second particles with respect to 100 parts by weight of the second composition.

18. The solar cell of claim 16, wherein the second composition contains 15 parts by weight to 40 parts by weight of the binder with respect to 100 parts by weight of the second composition.

19. The solar cell of claim 16, wherein a viscosity of the second composition is in a range of 200 Pa·s to 300 Pa·s.

20. The solar cell of claim 1, wherein the plurality of pad portions include the first particles and the second particles, and further include a binder and a void between the first particles and the second particles.

* * * * *